(12) United States Patent
Golke et al.

(10) Patent No.: US 9,165,633 B2
(45) Date of Patent: Oct. 20, 2015

(54) CARBON NANOTUBE MEMORY CELL WITH ENHANCED CURRENT CONTROL

(71) Applicant: Honeywell International Inc., Morristown, NJ (US)

(72) Inventors: Keith W. Golke, Minneapolis, MN (US); David K. Nelson, Medicine Lake, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/777,592

(22) Filed: Feb. 26, 2013

(65) Prior Publication Data
US 2014/0241052 A1 Aug. 28, 2014

(51) Int. Cl.
*G11C 7/00* (2006.01)
*G11C 11/40* (2006.01)
*G11C 13/00* (2006.01)
*G11C 13/02* (2006.01)
*B82Y 10/00* (2011.01)

(52) U.S. Cl.
CPC ............ *G11C 11/40* (2013.01); *B82Y 10/00* (2013.01); *G11C 13/0002* (2013.01); *G11C 13/0069* (2013.01); *G11C 13/025* (2013.01); *G11C 2013/0071* (2013.01); *G11C 2213/79* (2013.01)

(58) Field of Classification Search
CPC .... G11C 11/223; G11C 13/0002; G11C 8/08; G11C 11/16; G11C 11/40; G11C 13/0069; G11C 7/00
USPC .......... 365/182, 194, 185, 104, 156, 129, 189, 365/148, 177
See application file for complete search history.

(56) References Cited

U.S. PATENT DOCUMENTS

| | | | |
|---|---|---|---|
| 6,839,826 B2 | 1/2005 | Cernea |
| 7,113,426 B2 | 9/2006 | Rueckes et al. |
| 7,211,854 B2 | 5/2007 | Bertin et al. |
| 7,379,326 B2 | 5/2008 | Ushida et al. |
| 7,479,654 B2 | 1/2009 | Bertin et al. |
| 7,482,653 B2 | 1/2009 | Sandhu et al. |
| 7,549,012 B2 | 6/2009 | Cernea |
| 7,598,544 B2 | 10/2009 | Bertin et al. |

(Continued)

FOREIGN PATENT DOCUMENTS

| | | |
|---|---|---|
| EP | 2 309 515 A1 | 4/2011 |
| EP | 2309515 A1 | 4/2011 |
| EP | 2570385 A2 | 3/2013 |

OTHER PUBLICATIONS

"Lockheed Martin Tests Carbon Nanotube-Based Memory Devices Developed Jointly With Nantero," 2009, retrieved from http://ir.hhvc.com/releasedetail.cfm?ReleaseID=425172 on Jan. 13, 2014, 1 pp.

(Continued)

*Primary Examiner* — Hien Nguyen
(74) *Attorney, Agent, or Firm* — Shumaker & Sieffert, P.A.

(57) ABSTRACT

A desired current through a carbon nano tube (CNT) element of a CNT memory device can be controlled by a wordline voltage, and a voltage on the CNT common node can be held constant. The common node can be constant at a source voltage if a p-channel metal-oxide-semiconductor field-effect transistor (MOSFET) is used in the CNT memory device, or the common node can be constant at a supply voltage if an n-channel MOSFET is used in the CNT memory device.

14 Claims, 3 Drawing Sheets

(56) References Cited

U.S. PATENT DOCUMENTS

| | | | |
|---|---|---|---|
| 7,671,398 B2 | 3/2010 | Tran | |
| 7,675,768 B1 | 3/2010 | Kim | |
| 7,723,180 B2 | 5/2010 | Chen et al. | |
| 7,742,328 B2 | 6/2010 | Chen et al. | |
| 7,839,710 B2 | 11/2010 | Kam et al. | |
| 7,851,292 B2 | 12/2010 | Sandhu et al. | |
| 7,855,403 B2 | 12/2010 | Bertin et al. | |
| 7,864,560 B2 | 1/2011 | Tran | |
| 7,911,831 B2 | 3/2011 | Rueckes et al. | |
| 7,933,160 B2 | 4/2011 | Kim | |
| 7,943,464 B2 | 5/2011 | Berg et al. | |
| 7,948,054 B2 | 5/2011 | Bertin et al. | |
| 7,961,494 B2 | 6/2011 | Scheuerlein | |
| 2005/0041465 A1* | 2/2005 | Rueckes et al. | 365/177 |
| 2006/0250856 A1* | 11/2006 | Bertin et al. | 365/189.01 |
| 2008/0012047 A1 | 1/2008 | Bertin et al. | |
| 2008/0079027 A1 | 4/2008 | Bertin et al. | |
| 2008/0142850 A1 | 6/2008 | Bertin et al. | |
| 2008/0158936 A1* | 7/2008 | Bertin et al. | 365/148 |
| 2008/0159042 A1 | 7/2008 | Bertin et al. | |
| 2009/0154218 A1* | 6/2009 | Bertin et al. | 365/129 |
| 2009/0303801 A1* | 12/2009 | Kim | 365/189.05 |
| 2009/0323392 A1 | 12/2009 | Fasoli et al. | |
| 2011/0044091 A1 | 2/2011 | Bertin et al. | |
| 2011/0049463 A1 | 3/2011 | Yamamoto et al. | |
| 2011/0110141 A1 | 5/2011 | Tran | |
| 2011/0170333 A1 | 7/2011 | Kubo et al. | |
| 2011/0193042 A1* | 8/2011 | Maxwell | 257/1 |

OTHER PUBLICATIONS

Smith, R., "Nanotechnology: From the Lab to Devices—NRAM," Lockheed Martin Nanosystems, Feb. 2008, 27 pp.

Maguire, J., "Highlights," Lockheed Martin Space Systems Company, Spring 2010, 32 pp.

"Nantero—The principles of operation of NRAM," animated presentation presented by Nanopolis, 2004, webpage can be retrieved at: http://www.nantero.com/nram.html, accessed on Jan. 13, 2014.

Rinkio et al., "High-Speed Memory from Carbon Nanotube Field-Effect Transistors with High-K Gate Dielectric", Feb. 2009, ACS Publications, Nano Letters, 2 pp.

Hollingsworth et al., "Carbon Nanotube Based Nonvolatile Memory", Applied Physics Letters 87, Published online Dec. 2, 2005, 3 pp.

"Safety First," MicroPilot, downloadable from http://www.micropilot.com/product-tour-uav-horizon-01.htm, downloaded on Jan. 25, 2013, 1 pp.

U.S. Appl. No. 14/068,683, by Keith Golke, filed Oct. 31, 2013.

U.S. Appl. No. 13/846,677, by David K. Nelson, filed Mar. 18, 2013.

"High-Speed Memory from Carbon Nanotube Field-Effect Transistors with High-K Gate Dielectric", Rinkio et al., Feb. 2009, ACS Publications, Nano Letters, 2 pages.

Hollingsworth et al., "Carbon Nanotube Based Nonvolatile Memory", Applied Physics Letters 87, 2005, 3 pages.

Safety First, MicroPilot, downloadable from http://www.micropilot.com/product-tour-uav-horizon-01.htm, downloaded on Jan. 25, 2013., 1 page.

* cited by examiner

CARBON NANOTUBE MEMORY CELL WITH ENHANCED CURRENT CONTROL

STATEMENT REGARDING FEDERALLY SPONSORED RESEARCH OR DEVELOPMENT

This invention was made with Government support under 09-C-0070 awarded by the U.S. Government. The Government has certain rights in the invention.

TECHNICAL FIELD

This disclosure relates to memory devices and, more specifically, to non-volatile memory devices that use carbon nanotubes.

BACKGROUND

Most modern electronic devices include a power source, components for storing data, components for processing data, components for receiving user input, and components for delivering user output. It is desirable for such electronic devices to have long battery life, powerful processing capabilities, and large amounts of data storage, but at the same time, it is also desirable for electronic devices to maintain small and lightweight form factors. To meet these conflicting demands, it is desirable for the components of these devices to become smaller with better performance.

It is generally desirable for memory components, for example, to store more data in a smaller space with faster read and write operations. Current types of non-volatile memory include electro-mechanical hard drives where read/write heads read and write data from and to a series of rotating disks. Other types of non-volatile memory include solid state memories that use transistors and other devices (e.g., capacitors, floating gate MOSFETs) to store data without any moving parts and with faster read and write access.

SUMMARY

This disclosure generally describes techniques for reading and writing data from and to a carbon nanotube (CNT) memory device. The techniques may in some instances provide for faster and more precise read and write operations.

In one example, a method of performing write operations on a carbon nanotube based memory cell includes applying a first voltage to a gate of an access transistor; while applying the first voltage to the gate of the access transistor, changing a resistance of a carbon nanotube element to a first resistance value; applying a second voltage to the gate of the access transistor, wherein the second voltage is different than the first voltage; while applying the second voltage to the gate of the access transistor, changing the resistance of the carbon nanotube element to a second resistance value.

In another example, a carbon nanotube based memory cell includes a carbon nanotube (CNT) element comprising a first terminal and a second terminal; a p-channel metal oxide semiconductor field effect transistor (MOSFET), wherein a drain of the p-channel MOSFET is connected to the first terminal of the CNT element; a wordline connected to a gate of the p-channel MOSFET; a first bitline connected to a source of the p-channel MOSFET; and, a second bitline connected to the second terminal of the CNT element.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
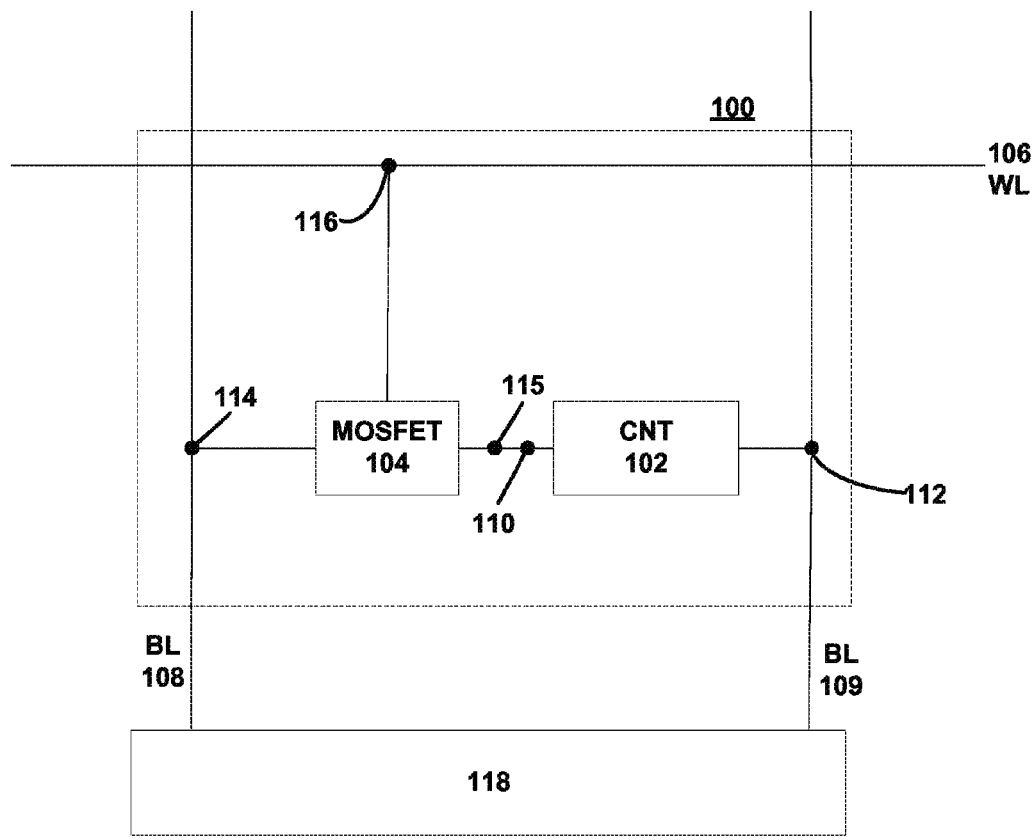
FIG. 1 shows a circuit diagram of a carbon nanotube based memory cell that may be used to implement techniques of the present disclosure.

FIG. 1 is a circuit diagram of a carbon nanotube based memory cell 100 that may be used to implement techniques of the present disclosure. Memory cell 100 may form part of a larger memory device that includes, for example, tens of billions of memory cells or more. Carbon nanotube memory cell 100 includes a carbon nanotube (CNT) element 102, an access metal-oxide semiconductor field effect transistor (access MOSFET) 104 that can be turned "ON" and "OFF" to control access to CNT 102, wordline (WL) 106, bitline (BL) 108, and bitline (BL) 109. CNT 102 includes a first terminal 110 and a second terminal 112, and access MOSFET 104 likewise includes a first terminal 114, a second terminal 115 and a third terminal 116. Bitline 109 connects to terminal 112 at a node, and bitline 108 connects to terminal 114 at a node. Wordline 106 connects to terminal 116 of access MOSFET 104 at a node. Terminal 115 connects to terminal 110.

Terminal 116 corresponds to a gate of access MOSFET 104, and terminal 114 and terminal 115 correspond to the source and drain, respectively, of access MOSFET 114. Bitline 109 and bitline 108 connect to bitline control circuitry 118 which controls the voltages applied to the bitlines and measures a current through CNT 102. The power source for this circuit (not shown in FIG. 1) provides the power supply voltage. This disclosure follows the convention that the more positive of the power supply nodes is labeled $V_{DD}$, and the more negative of the power supply nodes is labeled $V_{SS}$.

As used in this disclosure, the term node generally refers to a connection point where two or more terminals connect to one another or where one or more terminals connects to a line, such as bitline 108, bitline 109, or wordline 106. In FIG. 1, for example, terminal 115 of MOSFET 104 and terminal 110 of CNT 102 connect at a node; terminal 116 of MOSFET 104 and wordline 106 connect at a node; terminal 114 of MOSFET 104 and bitline 108 connect at a node; and, terminal 112 of CNT 102 and bitline 109 connect at a node. Typically, if a voltage is applied to a terminal or a line, then the same voltage is also applied to all terminals and lines of the same node. For instance, in the example of FIG. 1, if a voltage difference is applied to bitline 108 and bitline 109, then that same voltage difference is also applied to terminal 114 and terminal 112, which form nodes with bitline 108 and bitline 109 respectively. As another example, if a voltage is applied to wordline 106, then that same voltage is applied to terminal 116 which forms a node with wordline 106.

As will be described in greater detail below, in some implementations described in this disclosure access MOSFET 104 may be an n-channel MOSFET, while in other implementations access MOSFET 104 may be a p-channel MOSFET. If access MOSFET 104 is an n-channel MOSFET, then the gate of access MOSFET 104 connects to wordline 106. The source of access MOSFET 104 corresponds to the more negative of terminal 114 and terminal 115 during operation, and the drain of access MOSFET 104 corresponds to the more positive of terminal 114 and terminal 115 during operation. The body of access MOSFET 104 connects to either the source of MOSFET 104 or the most negative of the voltages applied during operation, which is typically the most negative of the power supply nodes ($V_{SS}$) or can be left floating if it can be isolated from all other MOSFET body terminals.

If access MOSFET 104 is a p-channel MOSFET, then the gate of access MOSFET 104 connects to wordline 106. The drain of access MOSFET 104 corresponds to the more negative of terminal 114 and terminal 115 during operation, and the source of access MOSFET 104 corresponds to the more positive of terminal 114 and terminal 115 during operation. The body of access MOSFET 104 connects to either the source of MOSFET 104 or the most positive of the voltages applied during operation, which is typically the most positive of the power supply nodes ($V_{DD}$) or can be left floating if it can be isolated from all other MOSFET body terminals.

Memory cell 100 can be operated in a manner that stores a single bit of data (i.e. a "0" or "1"). The storage data state of memory cell 100 can be a function of the resistance value of CNT 102. The resistance value of CNT 102 can be considered programmable in the sense that it can be set to a desired value (i.e. high or low), and this desired value can be considered to represent a bit of digital data. For example, a high resistance value for CNT 102 may correspond to a digital "0," and a low resistance value for CNT 102 may correspond to a digital "1". The resistance value of CNT 102 can be changed depending on the current and voltage applied to CNT 102 across terminals 110 and 112. Therefore, by controlling the voltage value and duration (i.e., pulse width time=Tpulse) of a voltage and current applied to CNT 102, the resistance value of CNT 102 can be written to the low resistance value that corresponds to a digital "1" or to the high resistance value that corresponds to a digital "0" as desired.

The empirically observed resistance change behavior of the CNT is as follows. If CNT 102 is in a low resistance state, then applying a high voltage difference across terminals 110 and 112 results in a high current flow through CNT 102. A high voltage with high current condition causes the resistance of CNT 102 to increase. The increased resistance, however, lowers the current through CNT 102 but the high voltage difference across terminals 110 and 112 is maintained. A high voltage with low current condition causes the resistance to decrease, taking CNT 102 back to a low resistance state. Once the resistance is low again, the current through CNT 102 once again increases, causing the resistance of CNT 102 to once again increase. In this manner, the resistance of CNT 102 oscillates between a high resistance state and a low resistance state when a high voltage difference is continuously applied across terminals 110 and 112.

The transition time between the high and low resistance states is finite. By controlling the voltage value and duration (Tpulse) of the applied voltage across terminals 110 and 112, CNT 102 can successfully be written to a "0" (i.e. a high resistance state) or written to a "1" (i.e. a low resistance state). Further, CNT 102 can be successfully be written to a "1" ($R_{low}$) by limiting the current the applied voltage can supply to a low level ($I_{low}$) that is insufficient to cause a $R_{low}$ to $R_{high}$ change. If initially CNT 102 is in a "0" ($R_{high}$) state, by limiting the current $V_{high}$ can provide to $I_{low}$, after CNT 102 has changed from $R_{high}$ to $R_{low}$, the $I_{low}$ limit prevents CNT 102 from changing back to an $R_{high}$ state and the Write "1" ($R_{low}$) operation is successfully completed. There is no current limiting approach that results in a successful Write "0" ($R_{high}$) operation since a high current is needed to produce the $R_{low}$ to $R_{high}$ state change. For purposes of explanation, this disclosure generally follows the convention that setting the resistance of CNT 102 to a high resistance (i.e. low conductivity) state is a "write 0" operation or "write low" operation, while setting the resistance of CNT 102 to a low resistance (i.e. high conductivity) state is a "write 1" or "write high" operation. Of course, these operations could also be logically reversed.

When reading CNT 102, it is generally desirable to keep the resistance state of CNT 102 unchanged. Thus, to read CNT 102, a low voltage difference which will not change the resistance value, is applied across terminals 110 and 112 by applying a low voltage difference across bitline 108 and bitline 109, the current through CNT 102 can be measured by bitline control circuitry 118. Based on the measured current and the voltage across bitline 108 and bitline 109, and having an access MOSFET with a resistance that is much less than the high resistance value of CNT 102, the resistance of CNT 102 can be determined to be either high or low. Depending on whether the resistance of CNT 102 is high or low, it can be determined if the value of memory cell 100 is a digital "0" or digital "1." As will be explained in greater detail below, the desired read condition for reading a resistance value of CNT 102 and the desired write conditions for changing a resistance value of CNT 102 can be achieved based on the voltages applied to wordline 106, bitline 108, and bitline 109.

The terms high resistance ($R_{high}$), low resistance ($R_{low}$), high voltage ($V_{high}$), low voltage ($V_{low}$), high current ($I_{high}$), and low current ($I_{low}$) are generally meant to be relative terms. A high resistance value is greater than a low resistance value ($R_{high} > R_{low}$). A high voltage can be equal to or greater than $V_{DD}$ and greater than a low voltage ($V_{DD} \leq V_{high} > V_{low}$). A low voltage is less than $V_{DD}$ but greater than $V_{SS}$ ($V_{DD} > V_{low} > V_{SS}$), and a high current is greater than a low current ($I_{high} > I_{low}$). The terms are not meant to imply specific resistances, voltages, or currents of any specific values.

When multiple nodes are defined to have a $V_{high}$ for a given operating condition, the voltage values may or may not be the same on the different nodes. When different operating conditions are defined to have a $V_{high}$, the voltage values may or may not be the same as in other operating conditions. When multiple nodes are defined to have a $V_{low}$ for a given operating condition, the voltage values may or may not be the same on the different nodes. When different operating conditions are defined to have a $V_{low}$, the voltage values may or may not be the same as in other operating conditions. $V_{DD}$ and $V_{SS}$ values can be applied to nodes by either direct connection to the $V_{DD}$ and $V_{SS}$ nodes or driven to $V_{DD}$ and $V_{SS}$ values through circuitry. A means to create $V_{high} > V_{DD}$ can be achieved by using a charge pump circuit. A means to create $V_{DD} >$ Vlow $> V_{SS}$ can be achieved by using a reference voltage ($V_{ref}$) generating circuit which typically contain a bandgap circuit. Both the charge pump and $V_{ref}$ circuits are commonly known in the integrated circuit industry. As examples, in some implementations where $V_{DD}=5V$, a low voltage for reading CNT 102 may be approximately 1V while a high voltage for writing to CNT 102 may be approximately 6-8V. A high resistance value corresponding to a "0" or low state may be approximately 10-100 giga-ohms, while a low resistance value corresponding to a "1" or a high state may be approximately 10-100 kilo-ohms An "ON" access MOSFET impedance may be approximately 1-10 kilo-ohms. These ranges of voltages and resistances, however, are merely examples, as the memory devices of the present disclosure can be configured to operate over other ranges of voltages and resistances.

In one example configuration, access MOSFET 104 is an n-channel MOSFET. In a first operating mode (operating mode 1), the value of memory cell 100 (i.e. the resistance of CNT 102) can be changed by applying a high voltage ($V_{high}$) to terminal 110 and a source voltage ($V_{SS}$) to terminal 112. $V_{SS}$ in some instances may be a ground voltage, but regardless of whether or not $V_{SS}$ is a ground voltage, $V_{SS}$ can be assumed to be a lower voltage than $V_{high}$ and $V_{low}$. The high voltage applied to terminal 110 can be achieved by applying a high voltage to 114 and a high voltage to terminal 116. Applying a $V_{DD}$ or high voltage to the gate (i.e. terminal 116) of MOSFET 104 causes MOSFET 104 to turn "ON" and conduct current between its source and its drain (i.e. between terminal 114 and terminal 110) and pass the high voltage from bitline 108 to terminal 110 but with some amount of voltage drop (i.e., Vdrop) across the access MOSFET. Thus, if a high voltage is applied to terminal 114 while a high voltage is also applied to terminal 116 that is high enough to account for the Vdrop across the MOSFET, a sufficiently high voltage can be presented at terminal 110. The high voltage across terminal 110 to terminal 112 can cause the resistance of CNT 102 to oscillate, as described above. Accordingly, a write 1 operation can be achieved by removing the high voltage across CNT 102 after the high to low resistance transition time (i.e. create a low resistance, which corresponds to a "1" being stored on CNT 102) through CNT 102. A write 0 operation can be achieved by removing the high voltage across CNT 102 after the low to high resistance transition time (i.e. create a high resistance, which corresponds to a "0" being stored on CNT 102) though CNT 102. Removing the high voltage across CNT 102 can be achieved by removing the high voltage at terminal 116 to turn "OFF" the access MOSFET causing current to stop flowing from terminal 114 to terminal 110, or by altering the voltage of bitline nodes 108 and/or 109. The time duration for the CNT device to change from a low to high resistance (write "0") and from a high to low resistance (write "1") is a characteristic of the CNT device technology and design and can be determined beforehand. Thus the time duration that the high voltage is applied across CNT 102 can be designed into the wordline or bitline control circuitry that results in successful write "0" or "1" operations. Common examples of circuits that can realize these duration times are delay lines and ring oscillators driving counters.

To read the value of memory cell 100 in operating mode 1, a high voltage can be applied at terminal 116 such that current flows through MOSFET 104 from terminal 114 to terminal 110, but a low voltage can be applied to bitline 108, such that the voltage drop from terminal 110 to terminal 112 is low, preventing the resistance of CNT 102 from changing. Bitline control circuitry 118 can measure the current flowing through CNT 102, and based on the measured current can determine the resistance state of CNT 102. Memory cell 100 can also be put into a standby mode by applying the source voltage to all of nodes 112, 114, and 116. In the standby mode, little or no current flows through CNT 102, preventing the resistance value of memory cell 100 stored on CNT 102 from changing.

The operating conditions of operating mode 1, can thus be summarized as follows:

|  | WL106 | BL108 | BL109 | Tpulse | Icnt | CNTresult |
|---|---|---|---|---|---|---|
| Write1: | $V_{high}$ | $V_{high}$ | $V_{SS}$ | $R_{high}$ to $R_{low}$ time | limit to $I_{low}$ | $R_{low}$ |
| Write0: | $V_{high}$ | $V_{high}$ | $V_{SS}$ | $R_{low}$ to $R_{high}$ time | allow $I_{high}$ | $R_{high}$ |
| Read: | $V_{high}$ | $V_{low}$ | $V_{SS}$ | NA | NA | $R_{unchanged}$ |
| Standby: | $V_{SS}$ | $V_{SS}$ | $V_{SS}$ | NA | NA | $R_{unchanged}$ |

In an alternate, second operating mode (operating mode 2), the value of memory cell 100 (i.e. the resistance of CNT 102) can be changed by applying a source voltage ($V_{SS}$) to terminal 110 and a high voltage to terminal 112. The source voltage applied to terminal 110 can be achieved by applying the source voltage to terminal 114 and a high voltage to terminal 116. Applying a high voltage to the gate (i.e. terminal 116) of MOSFET 104 causes MOSFET 104 to turn "ON" and conduct current between its source and drain (i.e. between terminal 114 to terminal 110) and pass the low voltage from terminal 108 to terminal 110 but with some amount of voltage drop (i.e., Vdrop) across the access MOSFET. Thus, if a source voltage is applied to terminal 114 while a high voltage is also applied to terminal 116, the source voltage is present at terminal 110. If the high voltage applied to terminal 112 is high enough to account for the Vdrop across the MOSFET, a sufficient high voltage can be realized across terminal 112 and terminal 110 that can cause the resistance of CNT 102 to oscillate, as described above. Accordingly, a write 1 operation can be achieved by removing the high voltage across CNT 102 after the high to low resistance transition time (i.e. create a low resistance, which corresponds to a "1" being stored on CNT 102) through CNT 102. A write 0 operation can be achieved by removing the high voltage across CNT 102 after the low to high resistance transition time (i.e. create a high resistance, which corresponds to a "0" being stored on CNT 102) though CNT 102. Removing the high voltage across CNT 102 can be achieved by removing the high voltage at terminal 116 to turn "OFF" the access MOSFET causing current to not flow between terminal 114 and terminal 110, or by altering the voltages of bitlines 108 or 109.

To read the value of memory cell 100 in operating mode 2, a high voltage can be applied at terminal 116 such that current flows through MOSFET 104 between terminal 114 and terminal 110, but a low voltage can be applied to bitline 109, such that the voltage drop from terminal 112 to terminal 110 is low, preventing the resistance of CNT 102 from changing. Bitline control circuitry 118 can measure the current flowing through CNT 102, and based on the measured current can determine the resistance state of CNT 102. Memory cell 100 can also be put into a standby mode by applying the source voltage to all of nodes 112, 114, and 116. In the standby mode, little or no current flows through CNT 102, preventing the value of memory cell 100 stored on CNT 102 from changing.

The operating conditions of operating mode 2, can thus be summarized as follows:

|  | WL106 | BL108 | BL109 | Tpulse | Icnt | CNTresult |
|---|---|---|---|---|---|---|
| Write1: | $V_{high}$ | $V_{SS}$ | $V_{high}$ | $R_{high}$ to $R_{low}$ time | limit to $I_{low}$ | $R_{low}$ |
| Write0: | $V_{high}$ | $V_{SS}$ | $V_{high}$ | $R_{low}$ to $R_{high}$ time | allow $I_{high}$ | $R_{high}$ |
| Read: | $V_{high}$ | $V_{SS}$ | $V_{low}$ | NA | NA | $R_{unchanged}$ |
| Standby: | $V_{SS}$ | $V_{SS}$ | $V_{SS}$ | NA | NA | $R_{unchanged}$ |

Figure 2:
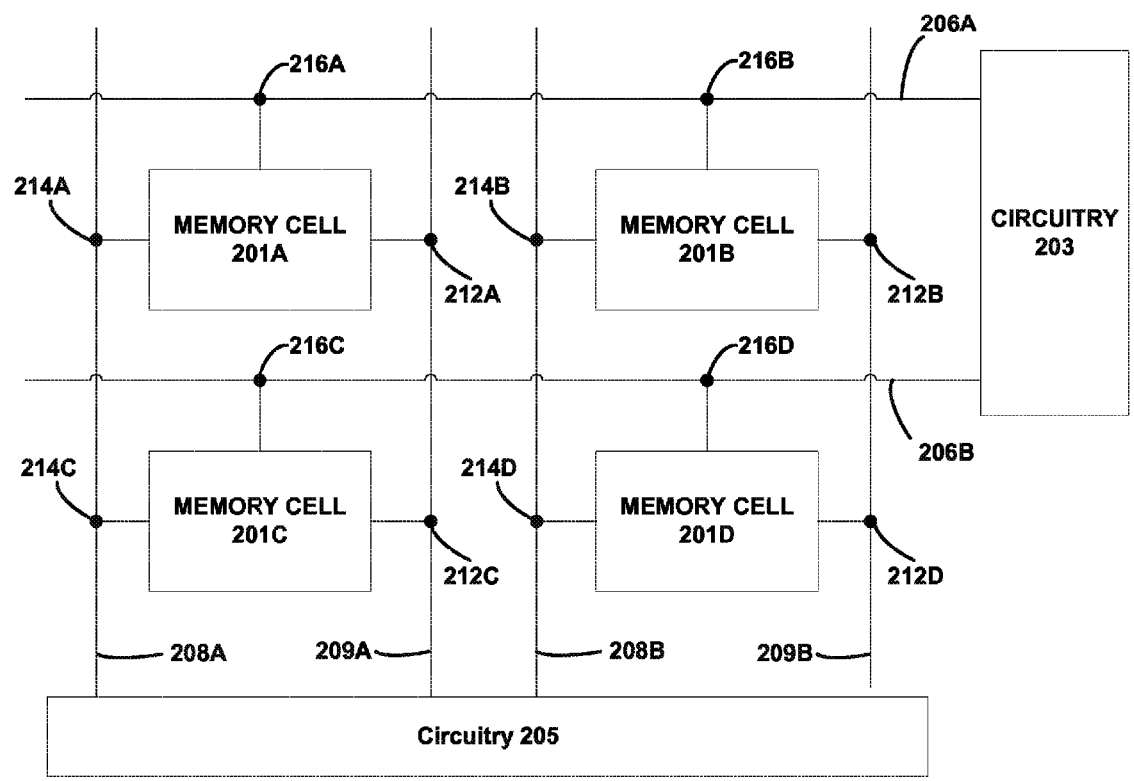
FIG. 2 shows a diagram of an array of CNT memory cells that may be used to implement the techniques of the present disclosure.

FIG. 2 shows a diagram of an array of memory cells 201A-D. Memory cell 201A, memory cell 201B, memory cell 201C, and memory cell 201D may each have structure and function similar to memory cell 100 of FIG. 1. Decode circuitry 203 (circuitry 203) controls wordline 206A and wordline 206B. Wordline 206A connects to memory cell 201A at node 216A and connects to memory cell 201B at node 216B. Wordline 206B connects to memory cell 201C at node 216C and connects to memory cell 201D at node 216D. Although, not explicitly shown in FIG. 2, each of nodes 216A-D may correspond to a gate of an access MOSFET as described in relation to access MOSFET 104 of memory cell 100 of FIG. 1. If memory cells 201A-D include an n-channel access MOSFET, then nodes 214A-D may each correspond to a source or drain terminal of an access MOSFET, with nodes 212A-D each corresponding to a terminal of a CNT element. If memory cells 201A-D include a p-channel access MOSFET, then nodes 214A-D may each correspond to a source or drain terminal of an access MOSFET, with nodes 212A-D each corresponding to a terminal of a CNT element.

FIG. 2 shows, for purposes of explanation, a 2-by-2 array of four memory cell, but an actual memory device may include an array of memory cells with tens of billions of individual memory cells or even more. Memory devices implementing one or more of the techniques described in this disclose may be implemented in a wide array of electronic devices ranging from small portable devices such as music players, smart phones, game cartridges, and memory sticks up to larger devices such as tablet computers, gaming devices or consoles, desktop computers, super computers, and enterprise storage solutions.

Bitline 208A connects to memory cell 201A at node 214A and connects to memory cell 201C at node 214C. Bitline 208B connects to memory cell 201B at node 214B and connects to memory cell 201D at node 214D. Although, not explicitly shown in FIG. 2, each of nodes 214A-D may correspond to a source or drain terminal of an access MOSFET as described in relation to access MOSFET 104 of memory cell 100 of FIG. 1.

Bitline 209A connects to memory cell 201A at node 212A and connects to memory cell 201C at node 212C. Bitline 209B connects to memory cell 201B at node 212B and connects to memory cell 201D at node 212D. Although, not explicitly shown in FIG. 2, each of nodes 212A-D may correspond to a terminal of a CNT element as described in relation to CNT 102 of memory cell 100 of FIG. 1.

By controlling the voltages applied to wordline 206A, wordline 206B, bitline 208A, bitline 208B, bitline 209A, and bitline 209B, the CNT elements of individual memory cells can be addressed. For example, suppose that a write operation is being performed on memory cell 201A using operating mode 2 as described above. Circuitry 203 may apply a high voltage to wordline 206A, and circuitry 205 may apply a high voltage to bitline 209A and a source voltage to bitline 208A. In this case, the high voltage applied to wordline 206A causes node 216A (connected to a gate of an access MOSFET, not shown in FIG. 2) to receive a high voltage. The high voltage applied to bitline 209A causes node 212A (connected to a terminal of a CNT element, not shown in FIG. 2) to receive a high voltage, and the source voltage applied to bitline 208A causes node 214A (connected to a source or drain of an access MOSFET) to receive a source voltage. As described above with respect to operating mode 2 and FIG. 1, the high voltage applied to node 216A causes current to flow through an access MOSFET, resulting in a high voltage drop across the CNT element of memory cell 201A. Thus, the resistance of the CNT element 201A can be changed.

While this write operation is occurring at memory cell 201A, it is intended that memory cells 201B, 201C, and 201D remain unchanged. Although the high voltage applied to wordline 206A can cause a high voltage at node 216B (connected to a gate of an access MOSFET in memory cell 201B), circuitry 205 may not apply a high voltage to either bitline 208B or 209B. In this case, with no high voltage drop across its CNT element, the state of memory cell 201B does not change.

Similarly, while this write operation is occurring at memory cell 201A, the high voltage applied to bitline 209A causes a high voltage at node 212C, and the source voltage applied to bitline 208A causes a source voltage at node 214C.

Circuitry 203, however, does not apply a high voltage to wordline 206B. Thus, the access MOSFET of memory cell 201C does not conduct current, and thus it is intended that this prevents current flow through the CNT element of memory cell 201C. Without a current flow, the resistance of the CNT element does not change, and the state of memory cell 201C does not change. Accordingly, by controlling the voltages applied to wordline 206A, wordline 206B, bitline 208A, bitline 208B, bitline 209A, and bitline 209B, in the manner described above, memory cells 201A, 201B, 201C, and 201D can be written to individually without altering the state of memory cells that are connected to a common wordline or common bitline.

When operating in operating mode 1 or 2, circuitry 205 can regulate the current to a column of memory cells and thus through the CNT element of the accessed memory cell to prevent a high current condition and thus prevent resistor state oscillation when performing a Write 1. However, bitlines 208A, 209A, 208B, and 209B can have a large capacitance. Referring back to FIG. 1, when access MOSFET 104 of a memory cell is turned on (i.e. a high voltage is applied to terminal 116) to do a mode 1 Write1 operation on a CNT 102 in a high resistance state, bitline 109 initially appears to be a virtual ground because of the large capacitance, which will allow a large current flow through CNT 102, which corresponds to a write 0 operation. Eventually the capacitance of bitline 109 will charge sufficiently for circuitry 205 to regulate a low current condition to achieve the desired write 1 operation, but the high resistance state of CNT 102 might be mega-ohms while the capacitance of bitline 109 might be pico-farads, causing an RC delay of micro-seconds for the memory cell to bring the bitline voltage high enough for circuitry 205 to take control. This delays the start of the Write 1 operation and thus, the time to successfully complete a write1 operation may be longer than desired. Likewise, the same behavior can occur when doing a mode 2 Write1 operation. Thus it is desirable to not control or limit the bitline current during a write operation.

Another difficulty associated with operating mode 1 relates to the access MOSFET (assumed to be an n-channel MOSFET for operating mode 1). When a high voltage is applied to bitline 108 and a source voltage is applied to bitline 109, access MOSFET 104 must pull the internal node (terminal 110) in memory cell 100 high. Access MOSFET 104, however, may only pull terminal 110 to the drain voltage minus MOSFET 104's turn on threshold voltage (Vt). Thus, a significant amount of the voltage applied to terminal 114 is dropped across MOSFET 104 instead of across CNT 102, where that voltage is needed to perform a write operation. Thus it is desirable to operate the access MOSFET 104 in such a way that does not result in a turn on threshold voltage (Vt) drop across the drain to source.

Operating mode 2 eliminates the turn on threshold voltage (Vt) drop across MOSFET 104, since the source voltage applied to bitline 108 puts MOSFET 104 into a mode where it must pull the internal node (terminal 110) in memory cell 100 low to a source voltage. However, many of the other problems associated with operating mode 1 still exist in operating mode 2. Additionally, by applying a high voltage to bitline 109, as in operating mode 2, as opposed to applying a high voltage to bitline 108, as in operating mode 1, the high voltage on bitline 109 may cause a write condition to form on memory cells that are not being addressed. For example, with reference to FIG. 2, if memory cell 201D is being addressed, a high voltage applied to bitline 209B may cause an unintended high voltage across the CNT element of memory cell 201B. This voltage across the CNT element of memory cell 201B may in some instances cause an unintended write operation to occur. This can occur because the voltage on internal terminal 110 inside memory cell 201B is initially equal to the bitline 209B voltage of $V_{SS}$ prior to the application of a high voltage to bitline 209B. When the a high voltage is applied to bitline 209B there is an RC delay from node 212B through memory cell 201B CNT 102 to memory cell 201B internal terminal 110. Thus, initially a high voltage occurs across memory cell 201B CNT 102 which is a condition for performing a write even though this is an unaccessed memory cell and its resistance state is to remain unchanged. This unintended write operation on a non-addressed memory cell can be avoided by slowly increasing the voltage on bitline 209B such that terminal 110 closely tracks terminal 112 to prevent a high voltage from forming across CNT 102 but this increases the time to do a write operation which is undesirable. This RC delay to memory cell internal terminal 110 can also interfere with a read operation. When $V_{low}$ is applied to bitline 209B some of the current will flow through the accessed memory cell but there will also be current that is charging up the memory cell internal terminal 110 in all the unaccessed memory cells in the column. If the read current is measured before these internal nodes are changed up the CNT 102 resistance will appear lower than it really is. Thus, the read must be delayed until the memory cell internal terminal 110 in all the unaccessed memory cells are fully charged up to the bitline 209B voltage. This slows the read time and is undesirable. Thus it is desirable to keep the bitline connected to the CNT terminal at the same constant voltage across all write, read and standby operations.

According to the techniques of this disclosure, additional operating modes may be implemented to address some of the shortcomings of operating mode 1 and operating mode 2. A third operating mode (operating mode 3) may reduce the time necessary to establish the desired current through the CNT element of a memory cell by using the wordline voltage to regulate the current. Using FIG. 1 as an example, instead of driving wordline 106 to a high voltage, wordline 106 can be driven to an intermediate voltage during a write1 operation to only partially turn on MOSFET 104 to limit the current through MOSFET 104 to $I_{low}$. The intermediate voltage ($V_{Ilow}$) applied to wordline 106 can be greater than $V_{SS}$ and less than $V_{high}$, and can be determined such that the gate to source voltage of MOSFET 104 limits the current through MOSFET 104, between nodes 114 and 110, to a value which is suitable for a write 1 operation (i.e., $I_{low}$). With operating mode 3, it is assumed that access MOSFET 104 is an n-channel MOSFET. Thus it is desirable to control or limit the current through CNT 102 by using the wordline voltage to limit the current through an n-channel access MOSFET 104.

During write 0 operations and read operations, however, wordline 106 may be driven to a high voltage in order to enable a large current through MOSFET 104 which is suitable for a write 0 operation (i.e., $I_{high}$). In this manner, the read and standby operations of operating mode 3 are the same as the read and standby operations of operating mode 2.

The operating conditions of operating mode 3, can thus be summarized as follows:

|  | WL106 | BL108 | BL109 | Tpulse | Icnt | CNTresult |
| --- | --- | --- | --- | --- | --- | --- |
| Write1: | $V_{low}$ | $V_{SS}$ | $V_{high}$ | $R_{high}$ to $R_{low}$ time | limit to $I_{low}$ | $R_{low}$ |
| Write0: | $V_{high}$ | $V_{SS}$ | $V_{high}$ | $R_{low}$ to $R_{high}$ time | allow $I_{high}$ | $R_{high}$ |
| Read: | $V_{high}$ | $V_{SS}$ | $V_{low}$ | NA | NA | $R_{unchanged}$ |
| Standby: | $V_{SS}$ | $V_{SS}$ | $V_{SS}$ | NA | NA | $R_{unchanged}$ |

According to the techniques of this disclosure, a fourth operating mode (operating mode 4) may also be utilized for reading and writing to a memory cell with a CNT element. As with operating mode 3, operating mode 4 may reduce the time necessary to establish the desired current through the CNT element of a memory cell by using the wordline voltage to regulate current. According to operating mode 4, access MOSFET 104 is a p-channel MOSFET. Using a p-channel MOSFET for access MOSFET 104 may reduce the voltage drop across access MOSFET 104, and thus increasing the voltage at terminal 110 and improving the speed with which read and write operations are performed. Further, it may also allow keeping the bitlines connected to the CNT 102 terminals at a constant voltage and thus prevent an unintended write operation to occur in unaccessed memory cells in the column of the accessed memory cell. Thus it desirable to control or limit the current through CNT 102 by using the wordline voltage to limit the current through an p-channel access MOSFET 104.

With a p-channel MOSFET, terminal 116 corresponds to a gate of access MOSFET 104, terminal 114 corresponds to a source of access MOSFET 104, and terminal 110 corresponds to a drain of access MOSFET 104. Unlike an n-channel MOSFET, applying a source voltage to terminal 116 causes access MOSFET 104 to conduct current between its drain and source (i.e. between terminal 110 and terminal 114). As with operating mode 3, however, an intermediate voltage ($V_{high}$-$V_{Ilow}$) can be applied to wordline 106 when performing a write 1 operation to only partially turn on MOSFET 104 to limit the current through MOSFET 104 to $I_{low}$. The intermediate voltage ($V_{high}$-$V_{Ilow}$) applied to wordline 106 can be determined such that the gate to source of voltage of access MOSFET 104 limits the current through access MOSFET 104, between nodes 114 and 110, to a value which is suitable for a write 1 operation (i.e., $I_{low}$).

During write 0 operations and read operations, wordline 106 may be driven to a source voltage in order to enable a large current through access MOSFET 104. In this manner, the read and standby operations of operating mode 4 are similar to the read and standby operations of operating modes 1-3.

The operating conditions of operating mode 4, can thus be summarized as follows:

|  | WL106 | BL108 | BL109 | Tpulse | Icnt | CNTresult |
| --- | --- | --- | --- | --- | --- | --- |
| Write1: | $V_{high}$-$V_{low}$ | $V_{high}$ | $V_{SS}$ | $R_{high}$ to $R_{low}$ time | limit to $I_{low}$ | $R_{low}$ |
| Write0: | $V_{SS}$ | $V_{high}$ | $V_{SS}$ | $R_{low}$ to $R_{high}$ time | allow $I_{high}$ | $R_{high}$ |
| Read: | $V_{SS}$ | $V_{low}$ | $V_{SS}$ | NA | NA | $R_{unchanged}$ |
| Standby: | $V_{high}$ | $V_{SS}$ | $V_{SS}$ | NA | NA | $R_{unchanged}$ |

According to the techniques of this disclosure, a fifth operating mode (operating mode 5) may also be utilized for reading and writing to a memory cell with a CNT element. With operating mode 5, it can be assumed again that access MOSFET 104 is an n-channel MOSFET. Operating mode 5 may reduce the time necessary to establish the desired current through the CNT element of a memory cell by keeping both bitline 108 and bitline 109 at $V_{high}$ in standby mode and keeping bitline 109 at the same constant voltage for all write, read and standby operations. As $V_{high}$ is the standby voltage for a memory cell, operating mode 5 can potentially avoid the invalid read and unintended write operations described above with respect to operating mode 2. In operating mode 5, access MOSFET 104 pulls terminal 110 from high to low when performing a write 1 operation or a write 0 operation. As with operating modes 3 and 4, a write 1 operation may be performed in operating mode 5 by applying an intermediate voltage ($V_{flow}$) to wordline 106, while write 0 and read operations can be performed by applying $V_{high}$ to wordline 106.

The operating conditions of operating mode 5, can thus be summarized as follows:

|  | WL106 | BL108 | BL109 | Tpulse | Icnt | CNTresult |
|---|---|---|---|---|---|---|
| Write1: | $V_{low}$ | $V_{SS}$ | $V_{high}$ | $R_{high}$ to $R_{low}$ time | limit to $I_{low}$ | $R_{low}$ |
| Write0: | $V_{high}$ | $V_{SS}$ | $V_{high}$ | $R_{low}$ to $R_{high}$ time | allow $I_{high}$ | $R_{high}$ |
| Read: | $V_{high}$ | $V_{high}$-$V_{low}$ | $V_{high}$ | NA | NA | $R_{unchanged}$ |
| Standby: | $V_{SS}$ | $V_{high}$ | $V_{high}$ | NA | NA | $R_{unchanged}$ |

Figure 3:
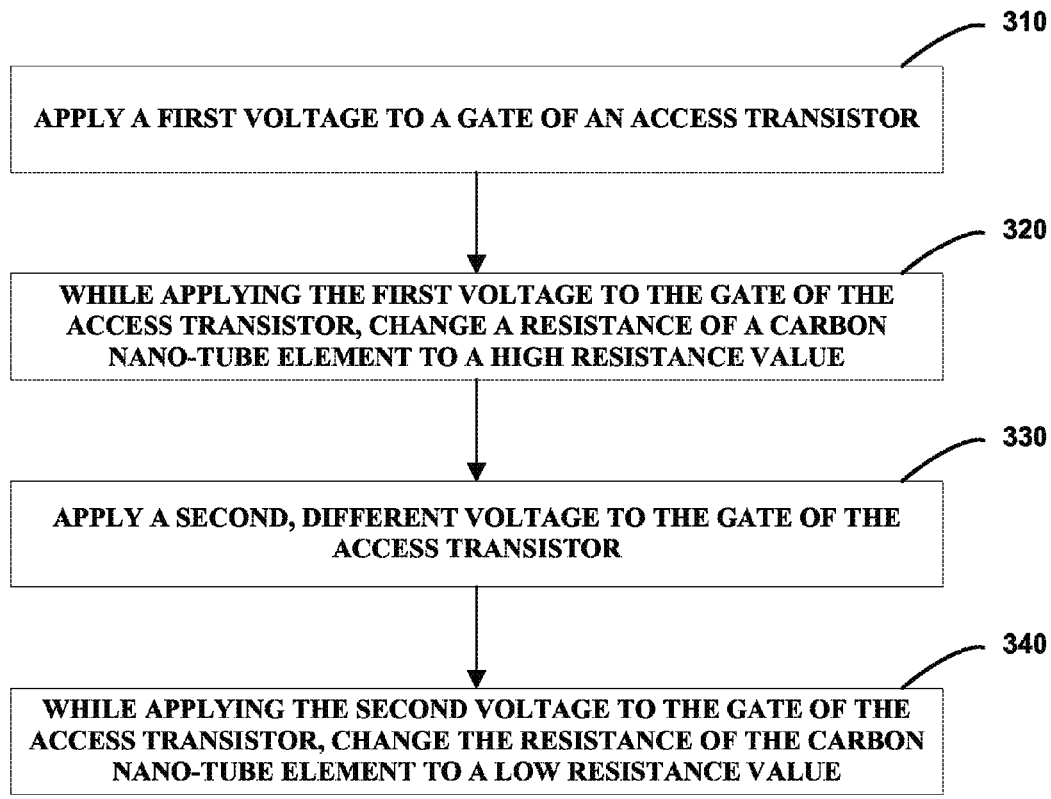
FIG. 3 shows a flowchart of a method of performing write operations on a carbon nanotube based memory cell in accordance with the techniques of this disclosure.

FIG. 3 shows a flowchart of a method of performing write operations on a carbon nanotube based memory cell in accordance with the techniques of this disclosure. For purposes of explanation, the techniques of FIG. 3 will be described with reference to FIGS. 1 and 2. The current through an access transistor (e.g. access transistor 104 of FIG. 1) and thus through the CNT device connected in series can be regulated during a write operation by controlling the voltage applied to a wordline (e.g. wordline 106 of FIG. 1). For example, a first voltage can be applied to a gate (i.e. terminal 116) of an access transistor, such as access MOSFET 104 (block 310) that allows the current through CNT 102 to be $I_{high}$. The voltage applied to the gate is the voltage applied to wordline 106. While applying the first voltage to the gate of access MOSFET 104, the resistance of a carbon nanotube element (e.g. CNT 102) can be written to a high resistance value (block 320). To prevent CNT 102 from returning to a low resistance value the first voltage may be removed after a time duration equal to the $R_{low}$ to $R_{high}$ transition time. In other instances, however, a second voltage, different than the first voltage, can be applied to wordline 106 (hence also applied to terminal 116 and the gate of access MOSFET 104) (block 330) that limits the current through CNT 102 to $I_{low}$. While applying the second voltage to the gate of access MOSFET 104, the resistance of CNT element 102 can be written to a low resistance value (block 340). The $I_{low}$ limit prevents CNT 102 from returning to a high resistance value.

As described in more detail above, in some implementations access MOSFET 104 may be a p-channel MOSFET, while in other implementations access MOSFET 104 may be an n-channel MOSFET. In implementations where access MOSFET 104 is a p-channel MOSFET, changing the resistance of the carbon nanotube element to the low resistance value may comprise applying a source voltage to bitline 109 and applying a high voltage to bitline 108, as described above in relation to operating mode 4. Further, when changing the resistance of CNT 102 to a low resistance value but limiting the current to an $I_{low}$ value, the second voltage applied to wordline 106 and terminal 116 may be lower than the high voltage but higher than the source voltage.

Additionally, in implementations where access MOSFET 104 is a p-channel MOSFET, when changing the resistance of CNT element 102 to a high resistance value, a source voltage may be applied to bitline 109, and a high voltage may be applied to bitline 108, as described above in relation to operating mode 4. In such an implementation, the first voltage on wordline 106 may be approximately equal to the source voltage.

In implementations where access MOSFET 104 is an n-channel MOSFET, changing the resistance of CNT element 102 to the low resistance value may include applying a high voltage to bitline 109 and applying a source voltage to bitline 108. Further, when changing the resistance of CNT 102 to a low resistance value but limiting the current to an $I_{low}$ value, the second voltage applied to wordline 106 and terminal 116 may be lower than the high voltage but higher than the source voltage, as described above in relation to operating mode 3.

Additionally, in implementations where access MOSFET 104 is an n-channel MOSFET, when changing the resistance of CNT element 102 to a high resistance value, a high voltage may be applied to bitline 109, and a source voltage may be applied to bitline 108. In such an implementation, the first voltage on wordline 106 may be approximately equal to the high voltage, as described above in relation to operating mode 3.

For ease of explanation, the techniques of this disclosure have been presented with respect to five operating modes. It is to be understood, however, that the operating modes are not intended to be mutually exclusive. As just one example, it is contemplated that the techniques of operating mode 5, which include applying voltages other than $V_{SS}$ to the bitlines, may be used in conjunction with any of operating modes 1-4.

Various embodiments of the invention have been described. These and other embodiments are within the scope of the following claims.

The invention claimed is:

1. A method of performing write operations on a carbon nanotube based memory cell, the method comprising:
   applying a source voltage to a first bitline;
   applying a high voltage to a second bitline;
   applying a first voltage to a gate of an access transistor, wherein the first voltage comprises an intermediate voltage between the source voltage and the high voltage;
   while applying the first voltage to the gate of the access transistor, the source voltage to the first bitline, and the high voltage to the second bitline, changing a resistance of a carbon nanotube element to a first resistance value;
   applying a second voltage to the gate of the access transistor, wherein the second voltage is different than the first voltage;
   while applying the second voltage to the gate of the access transistor, the source voltage to the first bitline, and the high voltage to the second bitline, changing the resistance of the carbon nanotube element to a second resistance value, wherein the second resistance value is higher than the first resistance value.

2. The method of claim 1, wherein the access transistor is a p-channel MOSFET, the first bitline connects to a terminal of the carbon nanotube element, and the second bitline connects to a source of the p-channel MOSFET.

3. The method of claim 2, wherein the second voltage is approximately equal to the source voltage.

4. The method of claim 1, wherein the access transistor is an n-channel MOSFET, the first bitline connects to a source of the n-channel MOSFET, and the second bitline connects to a terminal of the carbon nanotube element.

5. The method of claim 4, further comprising:
   putting the carbon nanotube based memory cell into a standby mode, wherein putting the carbon nanotube based memory cell in the standby mode comprises:
   applying the source voltage to a gate of the access transistor.

6. The method of claim 4,
   wherein the second voltage is approximately equal to the high voltage.

7. The method of claim 4, further comprising:
putting the carbon nanotube based memory cell into a standby mode, wherein putting the carbon nanotube based memory cell into the standby mode comprises applying the high voltage to a gate of the access transistor.

8. The method of claim 1, wherein the access transistor is connected in series to the carbon nanotube element.

9. The method of claim 1, wherein applying the first voltage to the gate of the access transistor causes the current through the carbon nanotube element to be limited to a value that allows a change from the second resistance value to the first resistance value and prevents a change from the first resistance value to the second resistance value.

10. A carbon nanotube based memory cell comprising:
a carbon nanotube (CNT) element comprising a first terminal and a second terminal;
a p-channel metal oxide semiconductor field effect transistor (MOSFET), wherein a drain of the p-channel MOSFET is connected to the first terminal of the CNT element;
a wordline connected to a gate of the p-channel MOSFET and configured to receive a first voltage to change a resistance of the carbon nanotube element to a first resistance value and to receive a second voltage to change the resistance of the carbon nanotube element to a second resistance value;
a first bitline connected to the second terminal of the CNT element and configured to receive a source voltage;
a second bitline connected to a source of the p-channel MOSFET and configured to receive a high voltage, wherein the first voltage comprises an intermediate voltage between the source voltage and the high voltage.

11. The carbon nanotube based memory cell of claim 10, wherein the first voltage is higher than the second voltage.

12. The carbon nanotube based memory cell of claim 10, wherein the carbon nanotube based memory cell is part of a memory device comprises a plurality of carbon nanotube based memory cells.

13. The carbon nanotube based memory cell of claim 10, wherein the second voltage is approximately equal to the source voltage.

14. The carbon nanotube based memory cell of claim 10, wherein the wordline is further configured to receive the high voltage to put the carbon nanotube based memory cell into a standby mode.

* * * * *